United States Patent [19]

Nakao

[11] Patent Number: 5,863,677
[45] Date of Patent: Jan. 26, 1999

[54] ALIGNER AND PATTERNING METHOD USING PHASE SHIFT MASK

[75] Inventor: Shuji Nakao, Hyogo, Japan

[73] Assignee: Mitsubishi Denki Kabushiki Kaisha, Tokyo, Japan

[21] Appl. No.: 766,915

[22] Filed: Dec. 13, 1996

[30] Foreign Application Priority Data

Jul. 15, 1996 [JP] Japan .................................. 8-184876

[51] Int. Cl.$^6$ ...................................................... G03F 9/00
[52] U.S. Cl. ............................................................ 430/5
[58] Field of Search ................................ 430/5, 322, 324

[56] References Cited

U.S. PATENT DOCUMENTS 5,744,268  4/1998  Nakao .......................................... 430/5

FOREIGN PATENT DOCUMENTS 3-270213  12/1991  Japan .
4-22954   1/1992   Japan .
5-175102  7/1993   Japan .

*Primary Examiner*—S. Rosasco
*Attorney, Agent, or Firm*—McDermott, Will & Emery

[57] ABSTRACT

Exposure light 56 is split into first and second exposure light beams, and first and second phase shift masks 10A and 10B are irradiated with the first and second exposure light beams, respectively. In the first and second phase shift masks 10A and 10B a plurality of light shielding portions and a plurality of strip-shaped transmission portions are located between the plurality of light shielding portions for alternately inverting the phase of transmission exposure light. Transmitted and combined exposure light 78 resulting from interference is directed onto photoresist. In the above-described configuration, an aligner using a phase shift mask for forming a fine and dense contact hole pattern and a patterning method thereof are provided.

5 Claims, 22 Drawing Sheets

ELECTRIC
FIELD
OVER MASK

INTENSITY
OF LIGHT
ON WAFER

ELECTRIC FIELD OVER MASK

INTENSITY OF LIGHT ON WAFER

FIG. 17(c) PRIOR ART ELECTRIC FIELD OVER MASK

FIG. 17(d) PRIOR ART INTENSITY OF LIGHT ON WAFER

ELECTRIC FIELD OVER MASK

INTENSITY OF LIGHT ON WAFER

AMPLITUDE OF
LIGHT IMMEDIATELY
AFTER TRANSMITTED
THROUGH MASK

DISTANCE

AMPLITUDE OF
LIGHT IMMEDIATELY
AFTER TRANSMITTED
THROUGH MASK

AMPLITUDE OF LIGHT IMMEDIATELY AFTER TRANSMITTED THROUGH MASK AND COMBINED

DISTANCE

AMPLITUDE OF LIGHT ON WAFER

DISTANCE

INTENSITY OF LIGHT ON WAFER

DISTANCE

ALIGNER AND PATTERNING METHOD USING PHASE SHIFT MASK

BACKGROUND OF THE INVENTION

1. Field of the Invention

The present invention relates generally to aligners and patterning methods using a phase shift mask, and more particularly to an aligner and a patterning method by interference of light, using a phase shift mask for photoresist.

2. Description of the Background Art

High density integration and miniaturization in the field of semiconductor integrated circuit devices have remarkably advanced in recent years. Circuit patterns formed on semiconductor substrates (hereinafter referred to as wafers) have rapidly shrinked accordingly.

Among others, the photolithography technique has been widely recognized as a basic technique in patterning. This is why various developments and improvements have been made in this field. The shrinking of patterns seems to have no end, and there exists even a stronger demand for higher resolution of the patterns.

The photolithography technique is a patterning technique according to which a mask pattern (original picture) is transferred onto photoresist applied on a wafer, and the photoresist with the transferred pattern is used to pattern a film to be etched under the photoresist. When the pattern is transferred onto the photoresist, the photoresist is subjected to development, during which, with positive type photoresist, the exposed areas are removed, while with negative type photoresist, the unexposed areas are removed.

In general, the resolution limit R (nm) in the photolithography technique by means of demagnification exposure is represented as follows:

$$R = k_1 \cdot \lambda / (NA)$$

where $\lambda$ is the wave length (nm) of light, NA is the numerical aperture of a lens, and $k_1$ is a constant depending on the resist process.

As can be seen from the above expression, the resolution limit R may be reduced by reducing the values of $k_1$ and $\lambda$ while increasing the value of NA, in other words, by reducing the constant ki depending on the resist process and shortening the wavelength of exposure light, and increasing the numerical aperture of the lens.

It is however technically difficult to improve light sources and lenses, and such shortened wave length and higher NA may reduce the depth of focus $\delta$ ($\delta = k_2 \cdot \lambda / (NA)^2$) of light, resulting in lower resolution instead.

This is why improvement of photomasks and shrink patterns rather than light sources or lenses has been studied. In recent years, the phase shift mask has attracted much attention as a photomask in the super-resolution technique for improving pattern resolution. The structure and principles of such masks as half tone type and Levenson-type will be described in comparison with usual masks by way of illustration. As for the mask pattern, an entire pattern will be described.

In FIG. 15, (a) and (b) are a top and a cross section of a usual photomask, respectively, and (c) and (d) show the electric field over the photomask in use and the optical intensity of an optical image on the wafer. Referring to FIG. 15, at (a) and (b), the usual photomask has a metal mask pattern 103 formed on a glass substrate 101. In such a photomask, the electric field over the mask is spacially pulse-modulated by metal mask pattern 103 as shown in FIG. 15 at (c).

Referring to FIG. 15 at(d), with a pattern reduced in size, exposure light transmitted through the photomask reaches around the unexposed region (region in which the transmission of exposure light is interrupted by metal mask pattern 103) on the wafer because of the diffraction of light. Therefore, the unexposed region of the wafer is also irradiated with light, resulting in a reduced contrast of light (difference in optical intensity between the exposed region and the unexposed region of the wafer). As a result, the resolution degrades, which makes it difficult to transfer fine patterns.

In FIG. 16, (a) and (b) show a top and a cross section of a half tone type phase shift mask, respectively, and (c) and (d) show the electric field over the mask and the optical intensity of an optical image on the wafer, respectively. Referring to FIG. 16 at (a) and (b), the half tone type phase shift mask is provided with an optical member 106 called phase shifter. Note, however, that optical member 106 is formed only on a semitransparent film 103 on a glass substrate 101, where a two-layer structure of phase shifter 106 and semitransparent film 103 is formed. Phase shifter 106 serves to change the phase of transmitted light by 180°, and semitransparent film 103 serves to attenuate the intensity of exposure light without completely interrupting the exposure light.

Referring to FIG. 16 at (c), since the above-described phase structure is established between phase shifter 106 and semitransparent film 103, the phase of the electric field over the mask is alternately changed by 180°, and the intensity of the electric field of one phase is smaller than the intensity of electric field of the other phase. More specifically, the intensity of light is attenuated such that the phase of light transmitted through phase shifter 106 is changed by 180° and then the light transmitted through semitransparent film 103 as well allows the photoresist to remain at a prescribed thickness after development. Since the phases of light of adjacent exposed areas are reversed from each other, these two kinds of light in opposite phases cancel each other in the overlapping regions.

As a result, as shown in FIG. 16 at (d), the phase is reversed at edges of the exposure pattern, and the optical intensity at the edges of the exposure pattern may be reduced. Thus, the difference in optical intensity between the light transmitted through semitransparent film 103 and the light not transmitted therethrough increases, and the resolution of the pattern may be improved as a result.

In FIG. 17, (a) and (b) are a top view and a cross section showing a Levenson-type phase shift mask, and (c) and (d) show the electric field over the phase shift mask in use and the optical intensity of an optical image on the wafer, respectively. Referring to (a) and (b), when a contact hole pattern is formed in a Levenson-type phase shift mask, a transmission region 110 corresponding to a contact hole and a transmission region 111 surrounding transmission region 110 are formed in the mask. Transmission region 110 is provided with an optical member 105 called phase shifter.

On a glass substrate 101, a chromium mask pattern 103 is formed, on which transmission regions 110 and 111 and a light shielding region are formed, with transmission region 111 being provided with phase shifter 105. Phase shifter 105 serves to change the phase of transmitted light by 180°.

Referring to FIG. 17 at (c), phase shifter 105 provided in transmission region 111 as described above allows the electric field on the mask created by exposure light transmitted through the phase shift mask to have its phase alternately inverted by 180°. Exposure light is opposite in phase between transmission region 110 and transmission region 111, and therefore, the exposure lights cancel each other in the overlapping portion by the effect of optical interference.

As a result, as shown in FIG. 17 at (d), the intensity of the exposure light decreases between transmission region 110 and transmission region 111, and therefore, adequate difference in the intensity of the exposure light between the exposed area and the unexposed area on the wafer may be secured. Thus, the resolution may be improved and fine patterns may be transferred.

However, in order to form a contact hole pattern with a Levenson-type phase shift mask as described above, as shown in FIG. 17 at (a), transmission region 111 having phase shifter 105 surrounding transmission region 110 is necessary in addition to transmission region 110 corresponding to the contact hole. This precludes fine and densely located contact holes from being formed, and the position of a contact hole pattern is limited.

Phase shifter 105 should be provided so as to have a specified size in a specified area and with no defects such as local chips. More complicated mask patterns, however, made checking of such defects more difficult, resulting in increased time and cost for manufacturing phase shift masks.

On the other hand, the Levenson-type phase shift mask has the following advantages.

Referring to FIG. 18 at (a) and (b), the phase shift mask is provided with a line-space pattern. A plurality of light shielding films 103 having a fixed width extend in one direction, and transmission regions 112 between light shielding film 103 are provided with a phase shifter 105 for every other region.

As for the electric field of exposure light transmitted through such a Levenson-type phase shift mask, as shown in FIG. 18 at (c), electric fields directed in opposite directions are alternately distributed. Thus, the intensity of the exposure light on the wafer attains a distribution as shown in FIG. 18 at (d), a distribution having a high contrast. More specifically, by the Levenson-type phase shift mask, adequate contrast is advantageously secured for such a fine line-space pattern.

Reference 1 (Japanese Patent Laying-Open No. 4-22954) discloses a method of forming a fine contact hole pattern with a usual photomask. The method will now be described in detailed.

According to the patterning method, an interference aligner is used as an exposure device. FIG. 19 is a view schematically showing the configuration of the aligner. Referring to FIG. 19, the aligner includes a light source 201 emitting exposure light, an expander 202 for expanding the light emitted from light source 201, mirrors 203 and 206 bending the optical path of the exposure light, a half mirror 204 for reflecting part of the exposure light, a phase shift portion 205 for changing the phase of the exposure light, lenses 210 and 211 for paralleling the exposure light transmitted through mask 209, a half mirror 213 for interfering and combining the exposure light transmitted through mask 209, and a reduction lens 214 for reducing the exposure light resulting from the interference.

Now, the method of patterning using the aligner and photomask will be described.

The exposure light emitted from light source 201 is separated into two beams of exposure light by half mirror 204. One beam of exposure light is directed upon region 209a in photomask 209. The other beam of exposure light is transmitted through phase shift portion 205 to have a phase difference of 180°, for example, from that one beam of exposure light, and directed to region 209b in photomask 209 by mirror 206.

Regions 209a and 209b in photomask 209 are provided with first and second patterns for example as shown in FIG. 20 at (a) and FIG. 21 at (a), respectively. FIG. 20(b) and FIG. 21(b) are cross sectional views taken along lines A—A in (a) in FIG. 20 and (a) in FIG. 21, respectively. Referring to FIG. 20 at (a) and (b) and FIG. 21 at (a) and (b), the photomask having a metal mask pattern 103 is formed on glass substrate 101.

The amplitude of exposure light immediately after being transmitted through the first pattern (the electric field over the photomask) has a distribution as shown in FIG. 20 at (c). The amplitude of the exposure light immediately after being transmitted through the second pattern (the electric field over the photomask) has a distribution as shown in FIG. 21 at (c), because it has a phase difference of 180° with respect to the exposure light transmitted through the first pattern.

The two kinds of exposure light transmitted through the first pattern and second pattern interfere and are combined by half mirror 213. The amplitude of thus combined exposure light has a distribution as shown in FIG. 22 at (a). The resulting combined exposure light passes through demagnification lens 214 and is directed upon wafer 216 on stage 215.

The amplitude of the exposure light on wafer 216 has a distribution as shown in FIG. 22 at (b), and the intensity of the exposure light has a distribution as shown in FIG. 22 at (c). Referring to FIG. 22 at (c), the two kinds of exposure light interfere with each other and the intensities of the two kinds of exposure light cancel each other in the overlapping portions of these antiphase exposure light beams. Thus, difference in the intensity of exposure light beams between the exposed region and the unexposed region on the wafer may be secured, and fine patterns may be formed.

Note that a similar method is disclosed by Japanese Patent Laying-Open No. 3-270213 (Reference 2).

Meanwhile, the inventor has proposed a method of forming a fine contact hole by applying the advantages associated with the Levenson-type phase shift mask described above in Japanese Patent Application No. 08-181300 filed on Jun. 20, 1996 entitled "Patterning Method Using Phase Shift Mask". The method will be now described in detail.

In the patterning method, a double exposure is employed in which two phase shift masks are exposed to light.

FIGS. 23 and 24 are plane views schematically showing a first Levenson-type phase shift mask for use in the first exposure and a second Levenson-type phase shift mask for use in the second exposure, respectively. FIG. 25 is a schematic cross sectional view taken along line A—A shown in FIG. 23.

Referring to FIG. 23, first phase shift mask 10A for use in the first exposure in the double exposure method is a Levenson-type phase shift mask, for example, having a transparent substrate 1 of quartz and a light shielding film 3 of chromium.

First and second light transmission portions Tn and Ta transmit exposure light in phases 180° different from each other and are disposed alternately with light shielding film 3 in between. First and second light transmission portions Tn and Ta and light shielding portion S having light shielding film 3 each have a linear shape substantially parallel to the Y direction in each plan view. The line widths Wn and Wa of first and second light transmission portions Tn and Ta are approximately identical, and the line width Ws of light shielding portion S is finite.

Referring to FIG. 24, second phase shift mask 10B for use in the second exposure in the double exposure has a structure approximately identical to first phase shift mask 10A as described above. Therefore, the cross section taken along B—B for second phase shift mask 10B corresponds to the cross sectional structure shown in FIG. 25. Note, however, that in second phase shift mask 10B, first and second transmission portions Tn and Ta and light shielding portion S are formed in a linear shape substantially parallel to the X direction in the figure. Now, the patterning method using the phase shift mask will l be described.

FIG. 26 is a view for use in illustration of the patterning method using the phase shift mask. In FIG. 26, (a) is a schematic plan view showing how the first and second phase shift masks used in the double exposure overlap each other, (b) shows the intensity of light on the wafer surface along lines C—C and E—E in FIG. 26 at (a), and (c) shows the intensity of light on the wafer surface along line D—D in FIG. 26 at (a).

Referring to FIG. 26 at (a), a prescribed region of a semiconductor substrate coated with negative type resist is exposed with light through first phase shift mask (FIG.23) by means of a demagnification projection exposure method, and the image of the mask is transferred thereon in the process of forming a semiconductor integrated circuit. Then, the same region is exposed with light and the image of the second phase shift mask 10B (FIG.24) is transferred thereon. At the time, the pattern of the second phase shift mask is exposed with light approximately orthogonally to the pattern of the first phase shift mask.

Referring to FIG. 26 at (b), in the overlapping regions of transmission portions Tn or Ta of first and second phase shift masks 10A and 10B, the intensity of light on the wafer is higher than that in the overlapping regions of transmission portions Tn and shielding portions S or Ta and shielding portion S of first and second shift masks 10A and 10B.

Referring to FIG. 26 at (c), the overlapping regions of light shielding portions S of first and second phase shift masks 10A and 10B, the intensity of light on the wafer is lower than that in the overlapping regions of transmission portions Tn or Ta and light shielding portions S of first and second phase shift mask 10A and 10B. The light intensity on the wafer in the overlapping region of light shielding portions S is 0 or close to 0.

As in the forgoing, the two-dimensional distribution of the light intensity in the wafer surface subjected to the double exposure is as shown in FIG. 27.

Referring to FIG. 27, the densely hatched portions represent regions with lower light intensity, while the blank portions represent regions with higher light intensity. C—C, D—D and E—E in FIG. 27 correspond to C—C, D—D and E—E in FIG. 26 at (a), respectively.

After such exposure process, the usual developing process removes the photoresist in the dark portion (the densely hatched region in FIG. 27) for removal in the case of negative type resist, resulting in a hole pattern.

Reference 1 above describing above in the technique proposed by the inventors still encounters with the following problem.

Reference 1 discloses a method of forming a combined pattern of the first pattern as shown in FIG. 20 at (a) and the second pattern as shown in FIG. 21 at (a) as a desired pattern. However, in the intensity distribution of exposure light on the wafer shown in FIG. 22 at (c), if the intensity of exposure light corresponding to the second pattern region is lower than the intensity as a reference intensity for whether or not the photoresist can be removed by development, only the first pattern may be formed as a contact hole pattern with a high contrast. More specifically, whether a combined pattern is formed or a contact hole pattern is formed, it is essential to form the second pattern which permits the transmitted exposure light to have an opposite phase to the exposure light transmitted through the first pattern around the first pattern in order to form a pattern with high contrast.

This gives rise to the same problem associated with the Levenson-type phase shift mask having a contact hole pattern as described in conjunction with FIG. 17, and a fine hole pattern with densely located holes (hereinafter referred to as dense contact hole pattern) cannot be formed or the position for providing the contact hole pattern is limited.

Now, according to the technique proposed by the inventor, negative type photoresist is used in order to form a contact hole pattern. Referring to FIG. 27, in the case of a negative photoresist, the densely hatched portion in the figure, in other words the photoresist in the regions where the intensity of exposure light is almost 0 are dissolved during development, resulting in a contact hole pattern.

The exposure light generally while its intensity attenuated as progressing through resists. Therefore, along line F—F shown in FIG. 27, for example, light intensity SL as a reference intensity for whether or not resist is removed by development, attains a distribution as shown in FIG. 27 with respect to the depth of resist. Therefore, the hole pattern of developed photoresist sometimes takes a reversely tapered shape.

If the exposure light causes halation by the underlying film, the light is sometimes directed to the region which should not be exposed with light. As a result, part of the photoresist which should be dissolved and removed sometimes remains there. As a result, sometimes a desired dense hole pattern cannot be formed.

Generally, since the negative type photoresist allows polymers to swell in the process of development, the positive type photoresist is used for a pattern which requires higher resolution.

In the use of positive type photoresist, however, a hole pattern cannot be formed, as will be described below. The light intensity along line D—D shown in FIG. 26 at (a) has adequate contrast with respect to light intensity SL as shown in FIG. 26 at (c). The intensity of exposure light along lines C—C or E—E shown in FIG. 26 at (a) is higher than light intensity SL as shown in FIG. 26 at (b). In other words, adequate contrast cannot be created, and therefore photoresist positioned near C—C or E—E is dissolved at the time of development. The photoresist at the densely hatched portion shown in FIG. 27 remains, resulting in a dotted pattern.

SUMMARY OF THE INVENTION

The present invention is directed to a solution to the above-described problem.

It is an object of the invention to provide an aligner capable of precisely forming a dense hole pattern in photoresists.

Another object of the invention is to provide a patterning method using such an aligner.

An aligner according to one aspect of the invention includes a following portions. Exposure light is emitted from a light source. The exposure light is divided into a first exposure light and a second exposure light. The first exposure light is directed upon a first phase shift mask. The second exposure light is directed upon a second phase shift mask. The first transmission light transmitted through the first phase shift mask and the second transmission light transmitted through the second phase shift mask are allowed to interfere to form an interference transmitted light. The interference transmitted light is directed upon photoresist to be etched which is formed on a semiconductor substrate. The first phase shift mask includes a plurality of first strip-shaped transmission regions spaced apart and extending in a first direction and a plurality of first strip-shaped light shielding regions between the plurality of first strip-shaped transmission regions. In the plurality of first strip-shaped transmission regions, non-phase shift transmission regions having the phase of transmitted first non-phase shifted transmission light unchanged and phase shift transmission regions with the phase of transmitted first phase shifted transmission light different from the phase of the first non-phase shifted transmission light are alternately and repetitively provided.

The second phase shift mask includes a plurality of second strip-shaped transmission regions spaced apart and extending in a second direction orthogonal to the first direction, and a plurality of second strip-shaped light shielding regions between the plurality of second strip-shaped transmission regions. In the plurality of second strip-shaped transmission regions, non-phase shift transmission regions with the phase of the transmitted second phase non-shift transmission light unchanged and phase shift transmission regions with the phase of the transmitted second phase shifted transmission light different from the phase of the second non-phase shift transmission light are alternately and repetitively provided.

By means the above-described aligner, first, the exposure light emitted from the light source is divided into a first exposure light and a second exposure light. The first exposure light is directed upon the first phase shift mask. The thus directed first exposure light transmits through the phase shift transmission region and the non-phase shift transmission region in the first strip-shaped transmission region extending in the first direction. In transmitted first transmission light, the first phase shifted transmission light transmitted through the phase shift transmission region is different in phase from the first non-phase shifted transmission light transmitted through the non-phase shifted transmission region.

Meanwhile, the second exposure light is directed upon the second phase shift mask. The thus directed second exposure light is transmitted through the phase shift transmission regions and the non-phase shift transmission regions in the second strip transmission regions extending in the second direction orthogonal to the first direction. In the transmitted second transmission light, the second phase shifted transmission light transmitted through the phase shift transmission regions is different in phase from the second non-phase shift transmission light transmitted through the non-phase shift transmission regions.

Then, the first transmission light and the second transmission light interfere to form interference transmission light which is directed to photoresist. In the interference transmission light, the first phase shift transmission light and the first non-shape shifted transmission light, and the second phase shifted transmission light and the second non-phase shifted transmission light interfere with each other in crossing directions. The interference between the first phase non-shifted transmission light and the second non-phase shifted transmission enhances the light intensity of the interference transmission light. The interference between the first non-phase shifted transmission light and the second phase shifted transmission light weakens the intensity of the interference light. The interference between the first phase shifted transmission light and the second non-phase shifted transmission light weakens the intensity of the interference light. The interference between the first phase shifted transmission light and the second phase shifted transmission light enhances the intensity of the interference light. Thus, the interference transmission light on the photoresist, in other words the contrast of the optical image, may be increased, and a fine and dense contact hole pattern may be formed.

Preferably, the difference in phase between the first phase shifted transmission light and the first non-phase shifted transmission light and the difference in phase between the second phase shifted transmission light and the second non-phase shifted transmission light are both substantially $\pi$ radians.

In this case, the interference between the first non-phase shifted transmission light and the second non-phase shifted transmission light and the interference between the first phase shifted transmission light and the second phase shifted transmission light substantially enhances the intensity of the interference transmission light. The interference between the first non-phase shifted transmission light and the second phase shifted transmission light and the interference between the first phase shifted transmission light and the second non-phase shifted transmission light substantially weakens the light intensity of the interference transmission light almost to 0. Thus, the contrast of the interference transmission light on the photoresist may further be increased, and a fine and dense contact hole pattern may be formed of precise size.

More preferably, the first strip-shaped transmission region extending in the first direction crosses the second strip-shaped transmission region extending in the second direction at substantially right angles, the first strip-shaped transmission region has a fixed width with respect to the first direction and the second strip-shaped transmission region has a fixed width with respect to the second direction. The widths of the first and second strip-shaped transmission regions and the spaces between the plurality of first and second strip-shaped transmission regions are all substantially identical.

In this case, the distances between adjacent contact hole portions in the contact hole pattern are almost equal, and therefore the most dense contact hole pattern within a fixed area may formed.

A patterning method according to a second aspect of the invention uses a plurality of first transmission regions spaced apart and extending in a first direction, first strip-shaped light shielding regions between the plurality of first strip-shaped transmission regions, a first phase shift mask having phase shifters provided for every other one of the plurality of first strip-shaped transmission regions, a plurality of second strip-shaped transmission regions spaced apart and the extending in a second direction crossing the first direction, second strip-shaped light shielding regions between the plurality of second strip-shaped transmission regions, and a second phase shift mask having phase shifters provided for every other one of the plurality of second strip-shaped transmission regions. Exposure light emitted from the light source is divided into the first exposure light second exposure light, and the first exposure light is directed upon the first phase shift mask, and the second exposure light is directed upon the second phase shift mask. The first transmission exposure light transmitted through the first phase shift mask and the second transmission exposure light transmitted through the second phase shift mask are allowed to interfere and combined and directed upon the photoresist on the semiconductor substrate.

According to the method, in the first transmission exposure light transmitted through the first phase shift mask, the exposure light transmitted through the first strip-shaped transmission region provided with the phase shifter (exposure light A) is different in phase from the exposure light transmitted through the first strip-shaped transmission region without the phase shifter (exposure light B). In the second transmission exposure light transmitted through the second phase shift mask, the exposure light transmitted through the second strip-shaped transmitting region provided with the phase shifter (exposure light C) is different in phase from the exposure light transmitted through the second strip-shaped transmission region without the phase shifter (exposure light D). In the interference exposure light formed by combining the first transmission exposure light and the second transmission exposure light, the interference between exposure light A and exposure light C and the interference between exposure light B and D enhance the intensity of resulting interference exposure light. Meanwhile, the interference between exposure light A and D and the interference between exposure light B and C attenuate the intensity of interference exposure light.

Thus, the contrast of the resulting interference exposure light on the photoresist may be increased, and a fine and dense contact hole pattern results.

Preferably, a positive type photoresist is used for the photoresist.

In this case, the photoresist in the region with the higher intensity of interference exposure light is removed, and a contact hole pattern is formed.

More preferably, as the first and second phase shift masks, a single phase shift mask having in prescribed regions mask patterns identical to those formed in the first and second phase shift masks is used. In this case, the single phase shift mask is set in the aligner for interference exposure.

Therefore, as opposed to the case of interference exposure in which two phase shift masks are set in the aligner, registration of the two phase shift masks is not necessary. Therefore, a contact hole pattern with higher precision in size may be formed.

A phase shift mask according to a third aspect of the invention is used in an aligner which divides exposure light emitted from the light source into first and second exposure light, and forms patterns by directing interference exposure light combining the first and second exposure light by interference onto a photoresist on a semiconductor substrate. The phase shift mask has a first region in a position to be exposed with the first exposure light and a second region in a position to be exposed with the second exposure light. In the first region, there are a plurality of first strip-shaped transmission regions of a prescribed width spaced apart and extending in a first direction, and a plurality of strip-shaped light shielding regions between the plurality of first strip-shaped transmission regions. The plurality of first strip-shaped transmission regions are provided with phase shifters for every other region making the phase of transmitted light different from the phase of exposure light. In the second region, a plurality of second strip-shaped transmission regions spaced apart and extending in a second direction orthogonal to the first direction, and a plurality of second light shielding regions between the plurality of second strip-shaped transmission regions. In the plurality of second strip-shaped transmission regions, phase shifters are provided for every other regions.

In this configuration, in the first exposure light directed and transmitted through the first region, the exposure light transmitted through the first strip-shaped transmission regions with the phase shifter (exposure light E) is different in phase from the exposure light transmitted through the first strip-shaped transmission region without the phase shifter (exposure light F). Also, in the second exposure light directed and transmitted through the second region, the exposure light transmitted through the second strip-shped transmission region provided with the phase shifter (exposure light G) is different in phase from the exposure light transmitted through the second strip-shaped transmission region without the phase shifter (exposure light H).

In the exposure light combined by interference, the interference between exposure light E and exposure light G as well as the interference between exposure light F and exposure light H enhances the intensity of the resultant interference exposure light. Meanwhile, the interference between exposure light E and exposure light H as well as the interference between exposure light F and exposure light G attenuates the intensity of the resultant interference exposure light.

Thus, the contrast of the interference exposure light on the photoresist may be increased, and fine and dense contact hole patterns may be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 23:
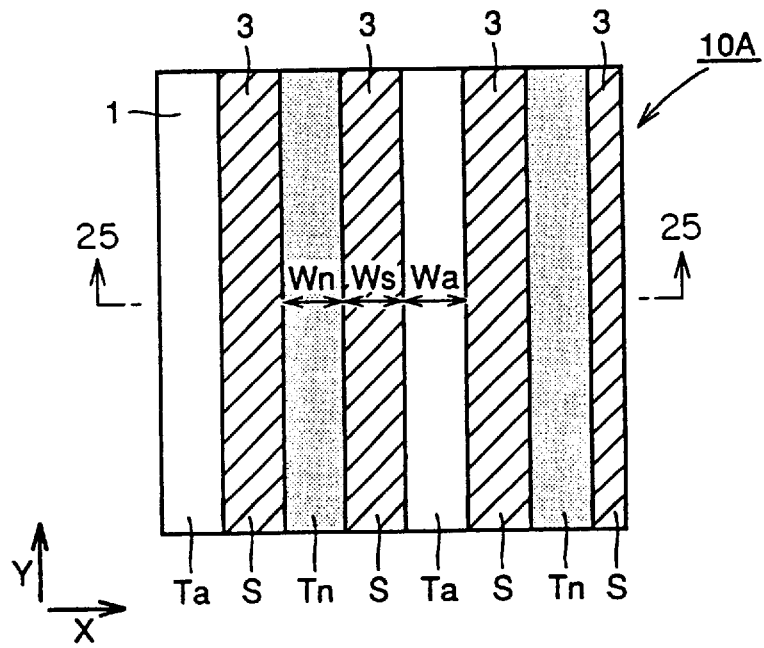
FIG. 23 is a plan view showing the configuration of a first phase shift mask used according to one embodiment of the invention and a conventional patterning method by way of illustration.
Figure 24:
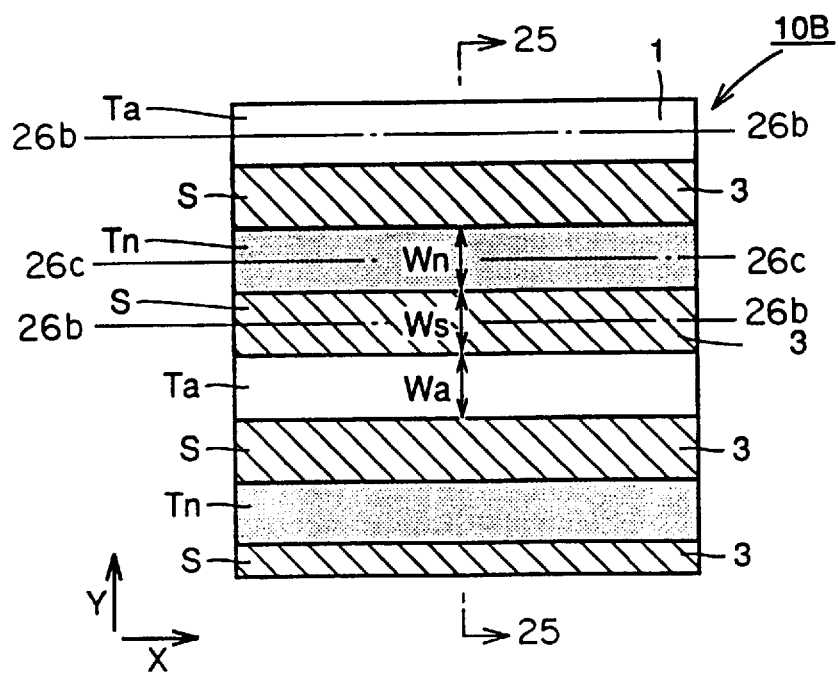
FIG. 24 is a plan view showing the configuration of a second phase shift mask used according to one embodiment of the invention and a conventional patterning method by way of illustration.
Figure 25:
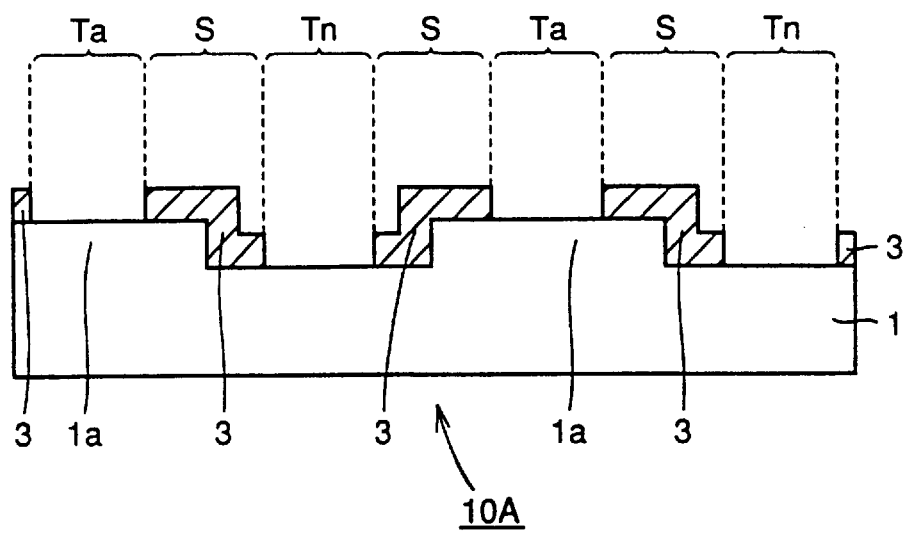
FIG. 25 is a cross sectional view taken along line A—A in FIG. 23.
Figure 26A:
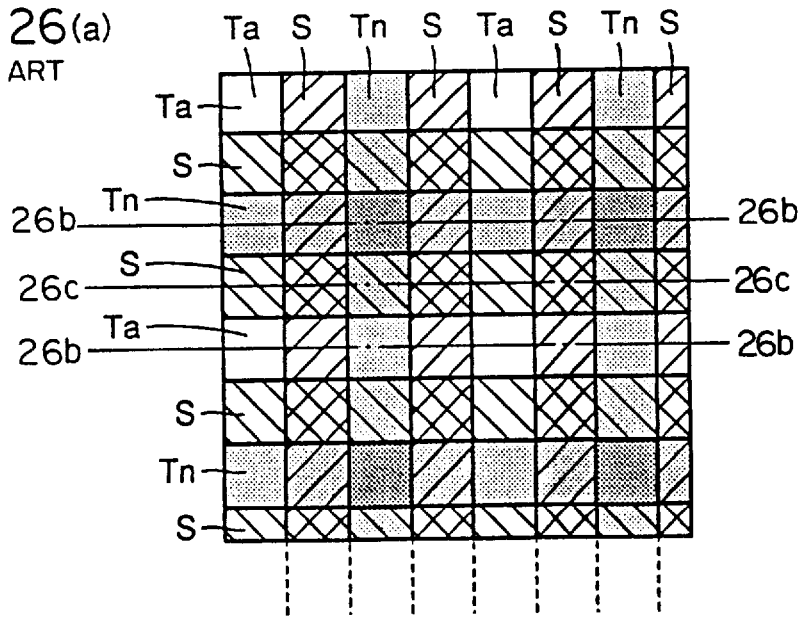
FIG. 26 is a representation for use in illustration of a patterning method using a conventional phase shift mask, wherein (a) is a plan view showing first and second phase shift masks placed upon each other, (b) shows the intensity of exposure light over the wafer taken along lines C—C and E—E in (a), and (c) shows the intensity of exposure light over the wafer along line D—D in (a)
Figure 26B:
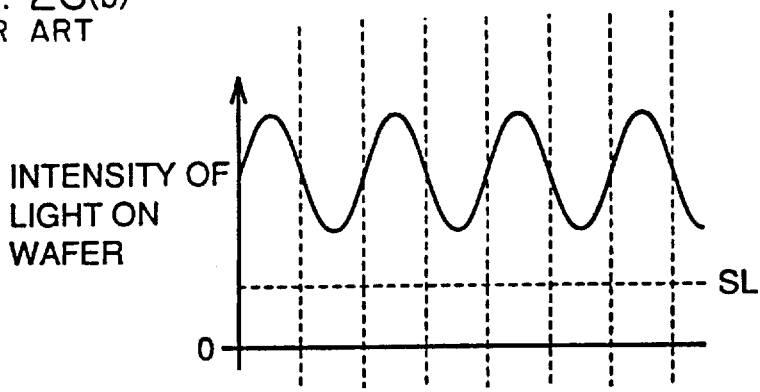
Figure 26C:
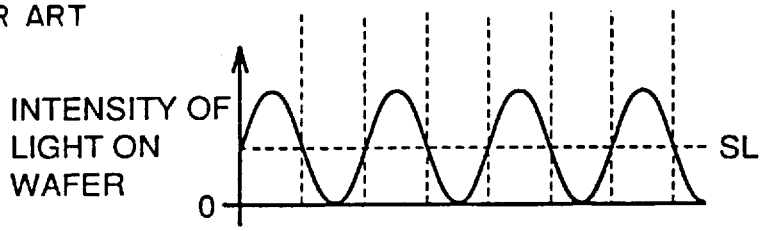

An exposure method according to one embodiment of the invention will be described in conjunction with the accompanying drawings. According to the method, exposure by interference is applied. The interference exposure uses a Levenson-type phase shift mask as shown in FIGS. 23 to 25 described in conjunction with the conventional techniques.

Figure 1:
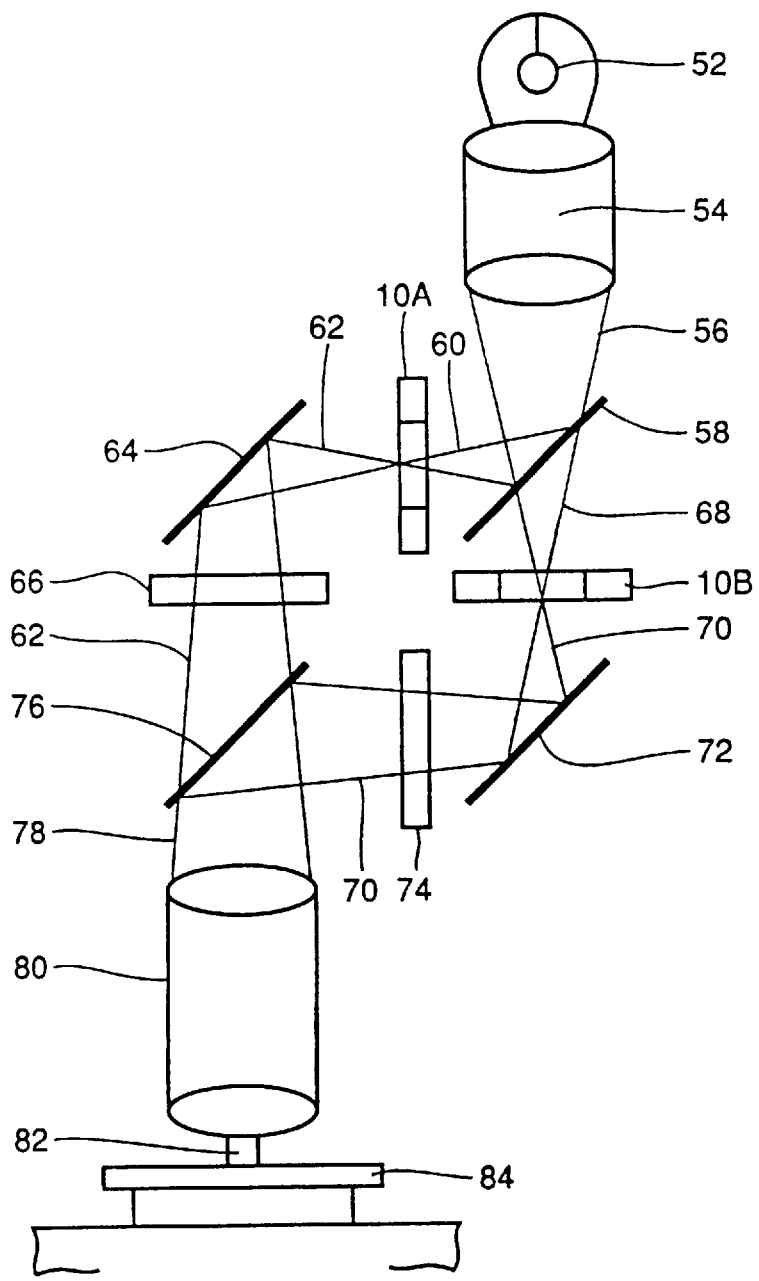
FIG. 1 is a view schematically showing an example of the configuration of an aligner according to an embodiment of the invention.

FIG. 1 is a diagram schematically showing the configuration of an aligner for exposure by interference. Referring to FIG. 1, on the front end of a light source 52 emitting KrF light, there is provided a condenser 54 concentrating light rays emitted from light source 52. At the light proceeding end of light 56 emitted from condenser 54, a beam splitter 58 is provided. Beam splitter 58 reflects and directs ½ the amount of incident light 56 at 90° with respect to the direction of incident of light 56, and the remaining half in the same direction as the incident direction of light 56.

A first phase shift mask 10A is provided in the direction in which exposure light 60 split by beam splitter 58 proceeds. In the direction of the exposure light 62 transmitted through first phase shift mask 10A, a reflective mirror 64 reflecting exposure light 62 at 90° with respect to the incident direction of exposure light 62 is provided. In the direction of exposure light 62 reflected by reflective mirror 64, a first adjuster 66 is provided. First adjuster 66 adjusts the phase of incident exposure light 62 as necessary and attenuates the optical intensity of exposure light 62.

Meanwhile, in the direction in which exposure light 68 resulting from splitting by beam splitter 58 proceeds, a second phase shift mask 10B is provided. In the direction of exposure light 70 transmitted through second phase shift mask 10B, a reflective mirror 72 is positioned for reflecting exposure light 70 at 90° with respect to the incidence direction of exposure light 70. In the direction of exposure light 70 reflected by reflective mirror 72, a second adjuster 72 is provided. Second adjuster 74 adjusts the phase of incident exposure light 70 as necessary and attenuates the optical intensity of exposure light 70.

Exposure light 62 and 70 transmitted through first and second adjusters 66 and 74, respectively are combined by interference at a beam splitter 76. Beam splitter 76 transmits exposure light 62 and reflects exposure light 70 in the direction at 90° with respect to the incident direction.

In the direction of exposure light 78 thus combined by interference, a projection optics system 80 formed of projection lenses is provided. Exposure light 82 transmitted through projection optics 80 is directed upon photoresist formed on a wafer 84.

Now, the first and second phase shift masks will be described. FIGS. 23 and 24 are plan views schematically showing the structures of first and second phase shift masks for use in the aligner shown in FIG. 1, respectively. FIG. 25 is a schematic cross section taken along A—A in FIG. 23 and B—B in FIG. 24. Since the structure of each portion has already been described in the foregoing section describing the conventional techniques, the same members are denoted with the same reference characters and will not be describing in detailed. Note that first and second phase shift masks 10A and 10B are placed such that the X-direction in FIG. 23 and the X-direction in FIG. 24 are substantially parallel to the surface of sheet.

Figure 2:
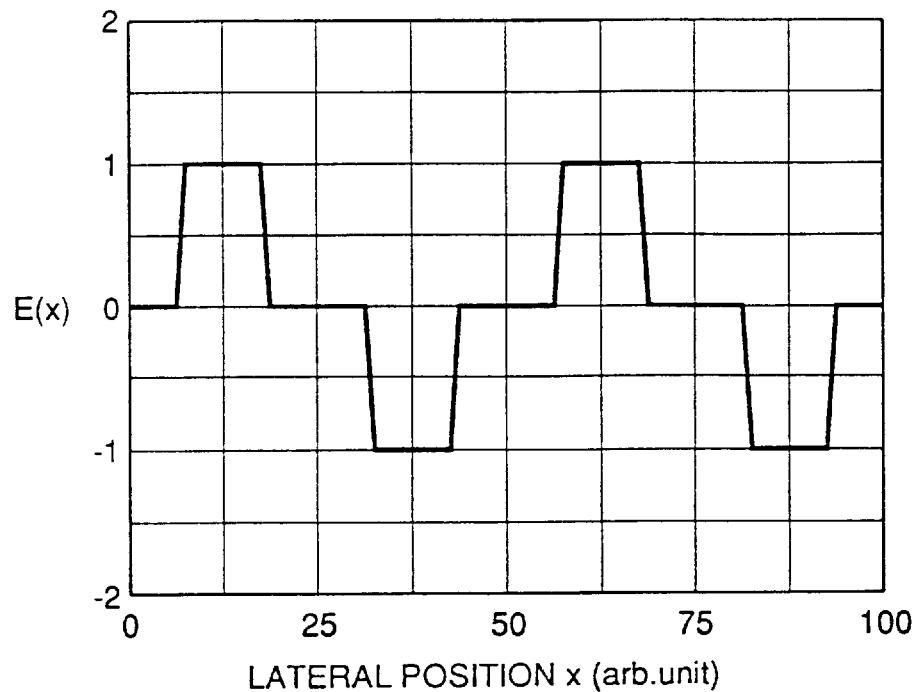
FIG. 2 is a graph showing the electric field of exposure light along A—A in FIG. 24 immediately after being transmitted through a first phase shift mask according to the embodiment.

Now, a patterning method using the phase shift masks and the aligner described above will be described in detailed. Referring to FIGS. 1, 23 to 25, exposure light 60 resulting from splitting at beam splitter 58 is transmitted through first phase shift mask 10A. The electric field of exposure light 60 immediately after being transmitted is shown in FIG. 2. FIG. 2 shows the electric field along A—A in FIG. 23. Referring to FIGS. 2 and 23, the electric field of exposure light transmitted through transmission portion Ta amounts to 1. The phase of exposure light transmitted through transmission portion Tn is deviated by about π radians from the phase of the exposure light transmitted through transmission portion Ta, and therefore the magnitude of the electric field is −1. Light shielding portion S does not transmit exposure light, and therefore the magnitude of its electric field is about 0.

Figure 3:
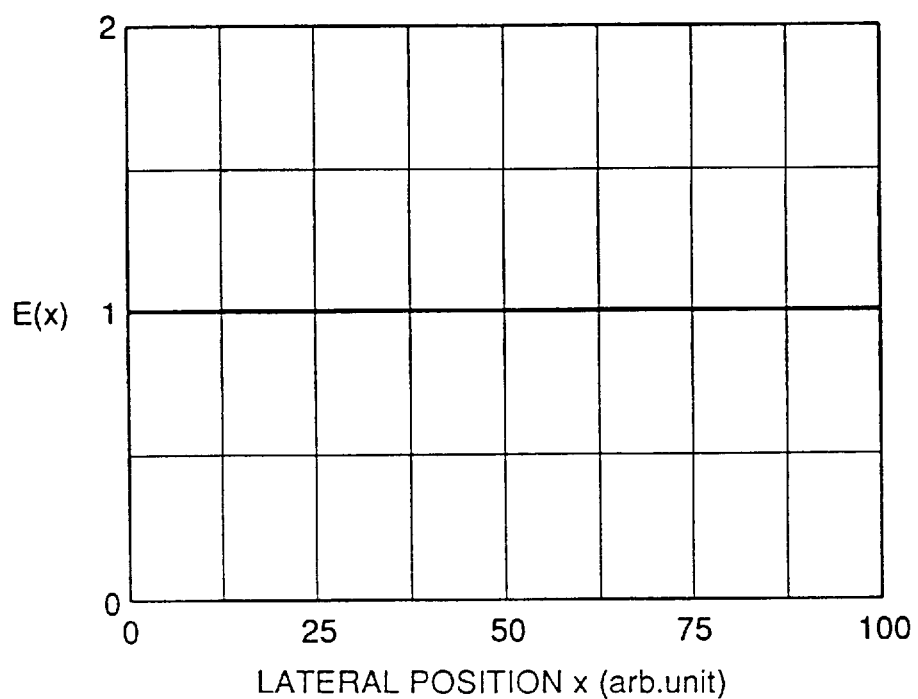
FIG. 3 is a graph showing the electric field of exposure light along C—C shown in FIG. 24 which has been transmitted through a second phase shift mask according to the embodiment.
Figure 4:
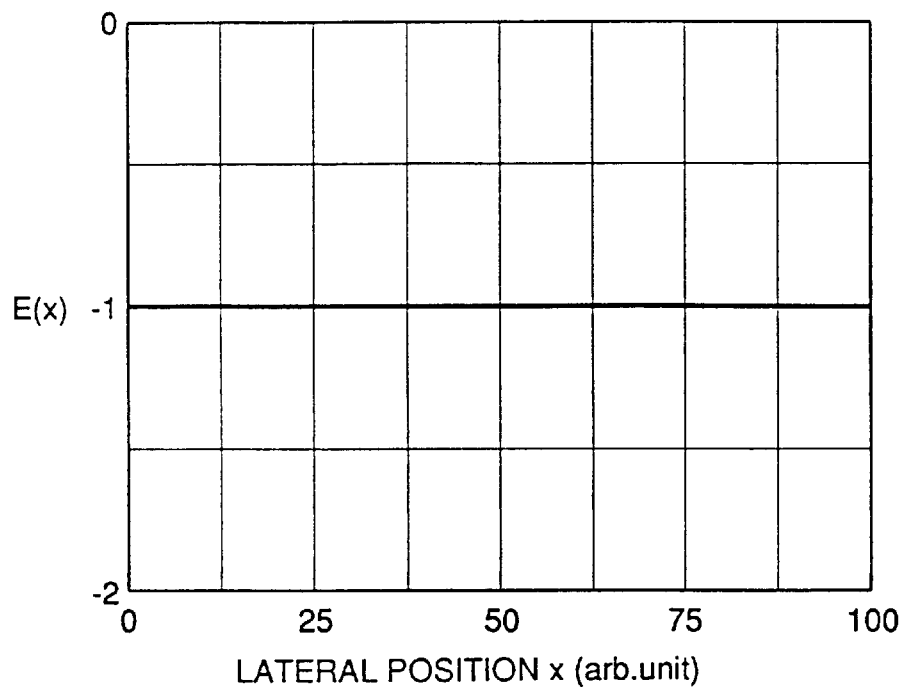
FIG. 4 is a graph showing the electric field of exposure light along D—D shown in FIG. 24 which has been transmitted through the second phase shift mask according to the embodiment.

Meanwhile, exposure light 68 resulting from splitting at beam splitter 58 is transmitted through second phase shift mask 10B. The electric field of the exposure light 70 immediately after being transmitted is shown in FIGS. 3 and 4. FIG. 3 represents the electric field along C—C shown in FIG. 24, and FIG. 4 the electric field along D—D in FIG. 24. Referring to FIGS. 3 and 24, the magnitude of the electric field of exposure light transmitted through transmission portion Ta is 1. Referring to FIGS. 4 and 24, the electric field of the exposure light transmitted through transmission portion Tn amounts to −1 for the above-described reason. Note that light shielding portion S does not transmit exposure light, and therefore the electric field is almost 0.

Now, referring to FIG. 1, exposure light 62 transmitted through first phase shift mask 10A has its direction changed by reflective mirror 64 and reaches beam splitter 76. Meanwhile exposure light 70 transmitted through second phase shift mask 10B has its direction changed by respective mirror 72 and reaches beam splitter 76. At beam splitter 76, exposure light 62 and exposure light 70 interfere with each other and combine into exposure light 78.

Figure 5:
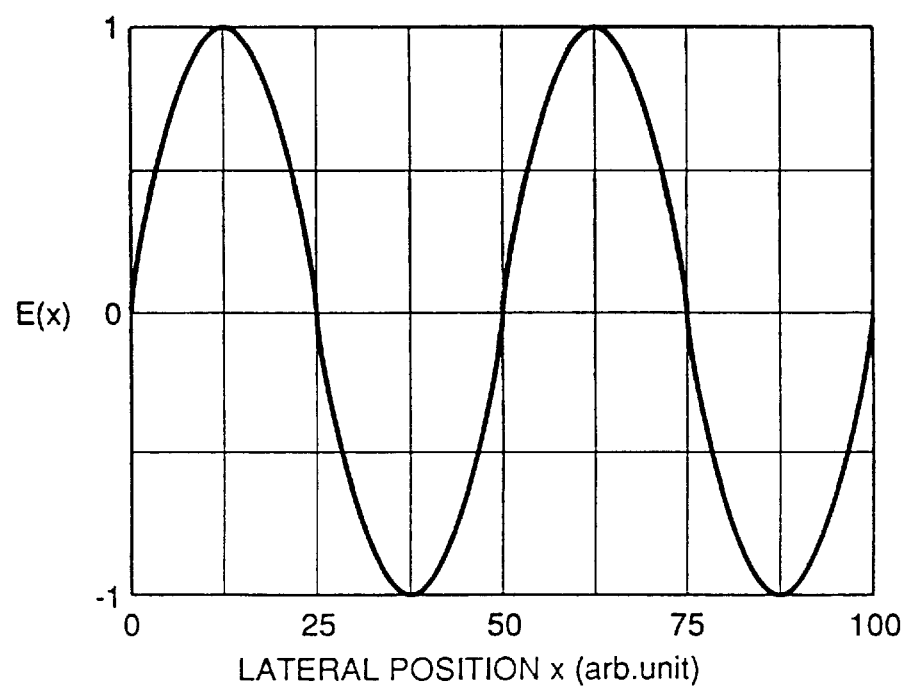
FIG. 5 is a graph showing an example of the electric field of exposure light along A—A in FIG. 23 which has been transmitted through a first phase shift mask according to the embodiment.
Figure 6:
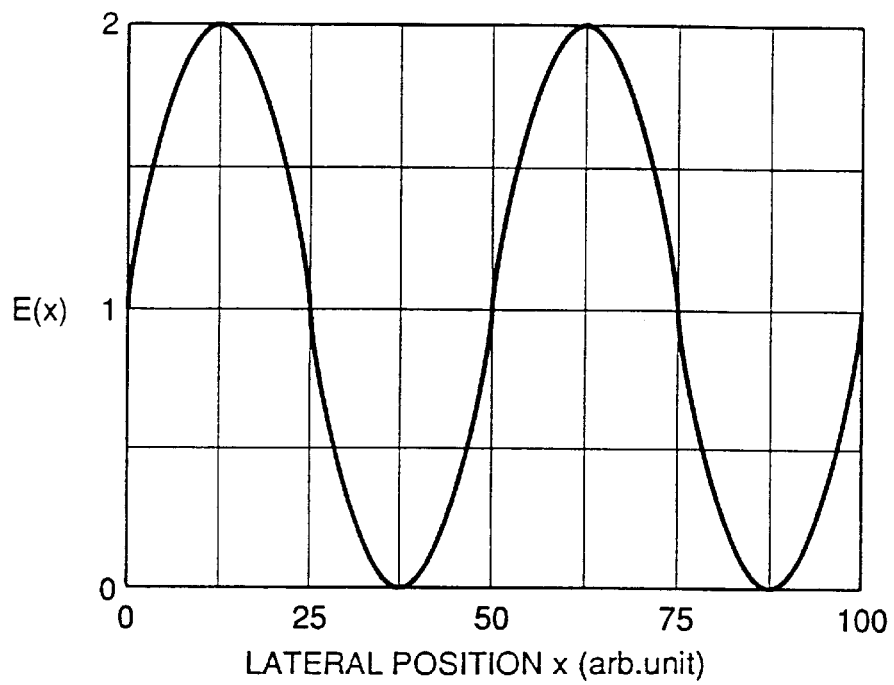
FIG. 6 is a graph showing the sum of the electric field shown in FIG. 3 and the electric field shown in FIG. 5.

The electric field of exposure light 78 will be described. The electric fields of exposure light 62 and 70 transmitted through first and second phase shift masks, respectively, have their changes relaxed by the diffraction of the exposure light as they proceed away from the phase shift masks. More specifically, referring to FIG. 1, exposure light 62 immediately after being transmitted through first phase shift mask 10A has an electric field as shown in FIG. 2, while it has an electric field as shown in FIG. 5 in the vicinity of beam splitter 76. The electric field as shown in FIG. 6 results by the summation of the electric field along A—A in FIG. 23 and the electric field along C—C shown in FIG. 24. The electric field shown in FIG. 7 results by the summation of the electric field along A—A in FIG. 23 and the electric field along D—D in FIG. 24. In addition, the electric field along E—E shown in FIG. 24 which is almost 0 plus the electric field along A—A shown in FIG. 23 will be almost the same as the electric field shown in FIG. 5.

Figure 7:
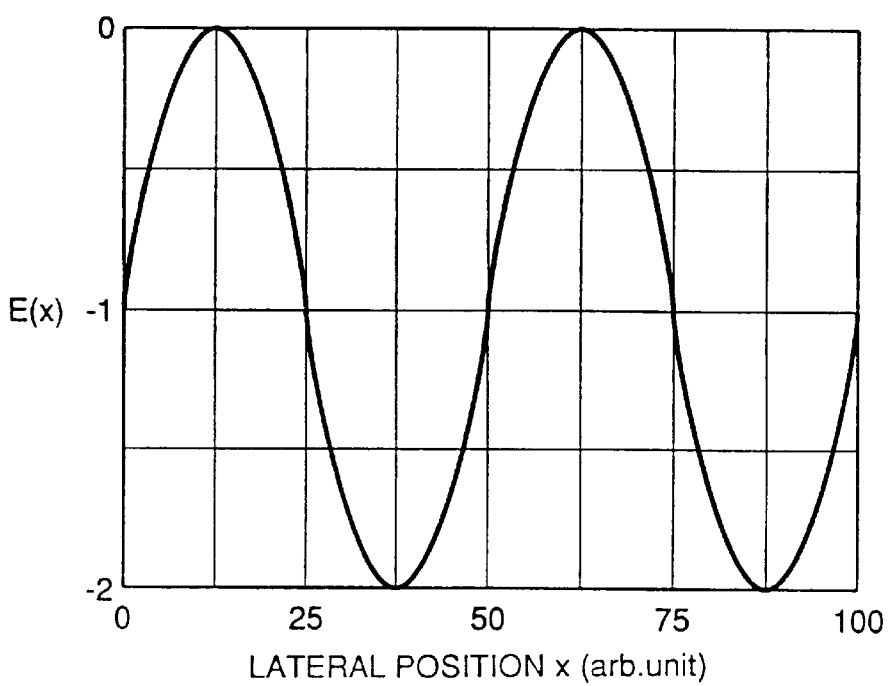
FIG. 7 is a graph showing the sum of the electric field shown in FIG. 4 and the electric field shown in FIG. 5.
Figure 8:
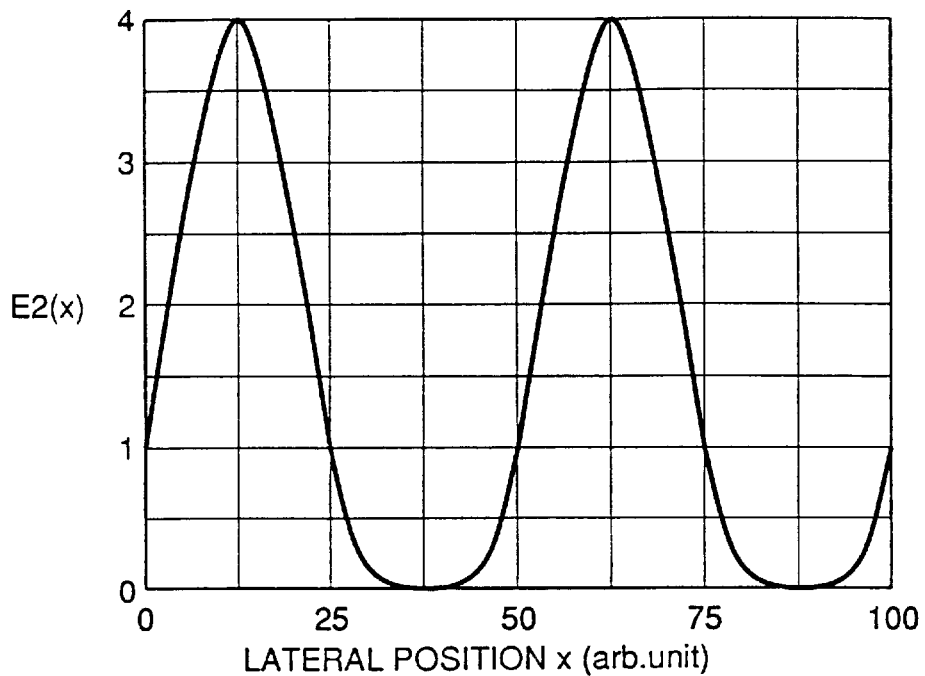
FIG. 8 is a graph showing the intensity of the electric field shown in FIG. 6.
Figure 9:
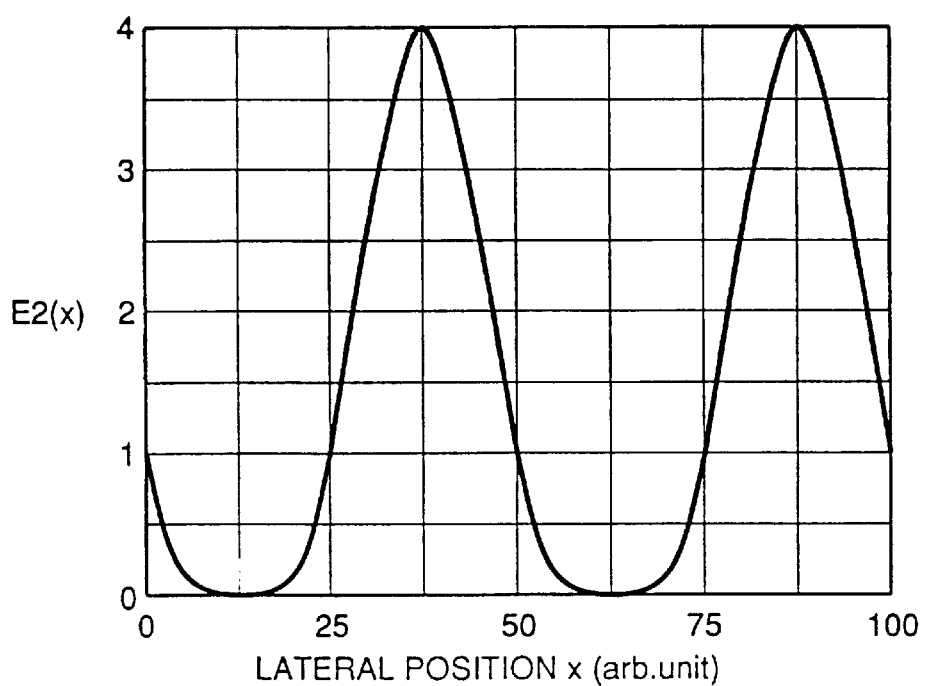
FIG. 9 is a graph showing the intensity of electric field shown in FIG. 7.
Figure 10A:
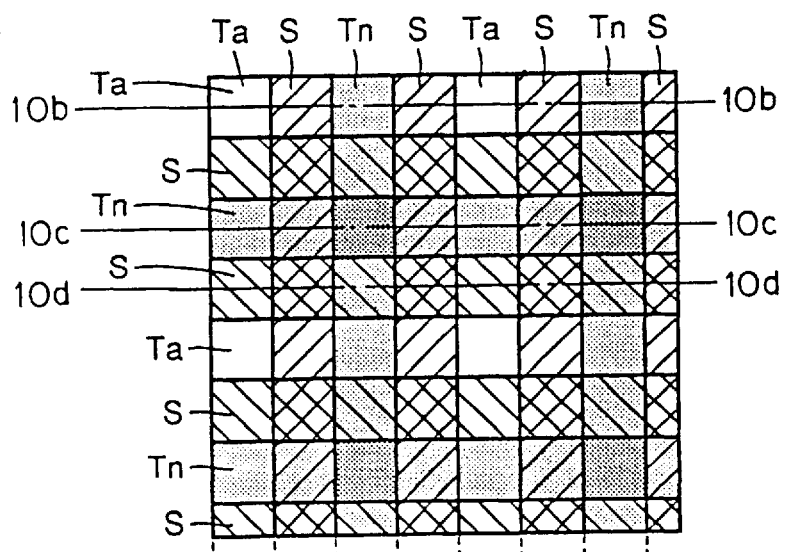
FIG. 10 shows a method of patterning by interference exposure using first and second phase shift masks according to the embodiment, wherein (a) shows relative placement of the first and second phase shift masks, (b) shows the intensity of the exposure light on the wafer along C—C in (a), (c) shows the intensity of the exposure light on the wafer along D—D in (a), and (d) shows the intensity of exposure light on the wafer along E—E in (a)
Figure 10B:
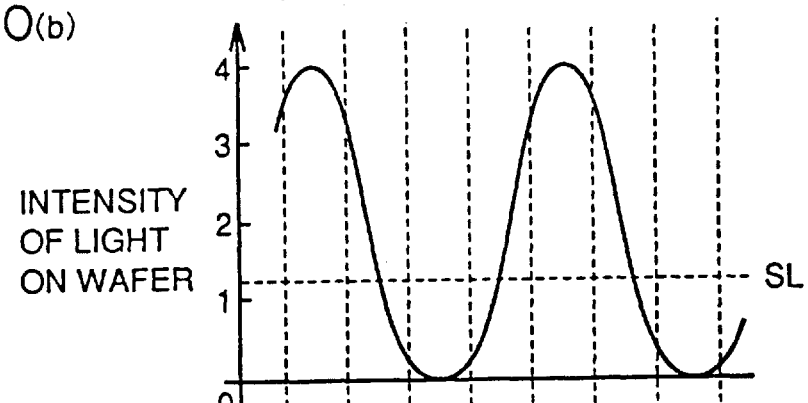
Figure 10C:
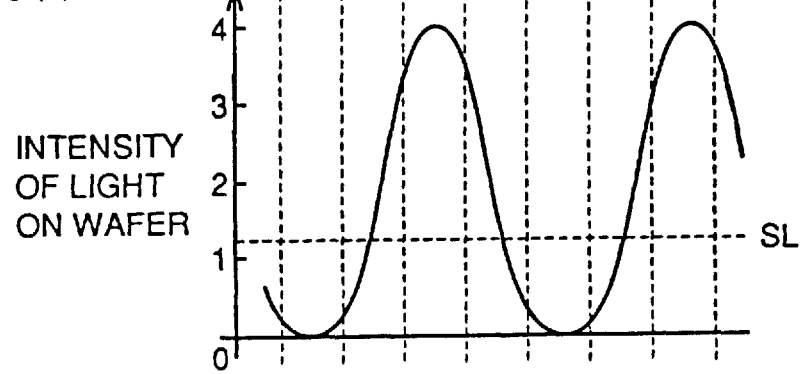
Figure 10D:
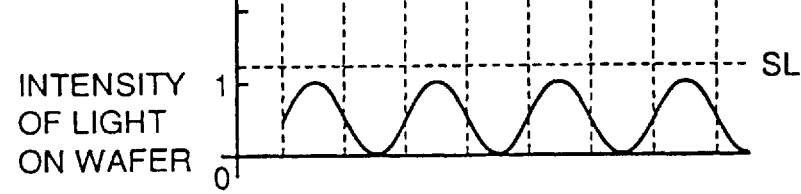

Since the intensity of the electric field is in proportion to the square of the electric field, the intensity of the electric field shown in FIG. 6 is as shown in FIG. 8, and the of electric field strength shown in FIG. 7 is as shown in FIG. 9.

This will be further detailed in comparison with the positional relation of first and second phase shift masks. FIG. 10 at (a) shows the relative positional relation between first and second phase shift masks in interference exposure. FIG. 10 at (b) shows the intensity of exposure light along C—C in FIG. 10 at (a). FIG. 10 at (c) shows the intensity of exposure light along D—D. FIG. 10 at (d) shows the intensity of the exposure light along E—E. Referring to FIG. 10 at (a) and (b), the intensity of exposure light resulting from interference between exposure light transmitted through the transmission portion Tn of first phase shift mask 10A and exposure light transmitted through transmission portion Ta of second phase shift mask 10B is largest. Meanwhile, exposure light resulting from interference between exposure light transmitted through the transmission portion Ta of first phase shift mask 10A and exposure light transmitted through the transmission portion Tn of second phase shift mask 10B is smallest in the intensity of exposure light and almost 0.

Referring to FIG. 10 at (a) and (c), the intensity of exposure light resulting from interference between exposure light transmitted through transmission portion Tn of first phase shift mask 10A and exposure light transmitted through transmission portion Tn of second phase shift mask 10B is largest. Meanwhile, the intensity of the exposure light resulting from interference between exposure light transmits through the transmitted portion Ta of first phase shift mask 10A and exposure light transmitted through the transmission portion Tn of second phase shift mask 10B is smallest and almost 0.

Referring to FIG. 10 at (a) and (d), at the relatively overlapping portion of light shielding portion 2 of first phase shift mask 10A and the light shielding portion S of second phase shift mask 10B, the intensity of exposure light is almost 0. In the other portion, the intensity of exposure light is at highest about ¼ the intensity of the highest intensity of exposure light shown in FIG. 10 at (b) and (c).

Now a , simulation conducted for studying the intensity distribution of exposure light on the wafer surface resulting from interferences described above will be described.

The following parameters are set as conditions for the first simulation. The line widths Wn, Ws and Wa of first and second phase shift masks shown in FIGS. 23 and 24 are each 0.16 μm. The wave length of exposure light is 248 nm (KrF wave length), the numerical aperture NA of light 0.55 and, coherence σ representing the degree of interference of light is 0.20. The cases with focus offsets ΔF of 0 μm (just focus) and 1.0 μm (defocus) are set.

Figure 11:
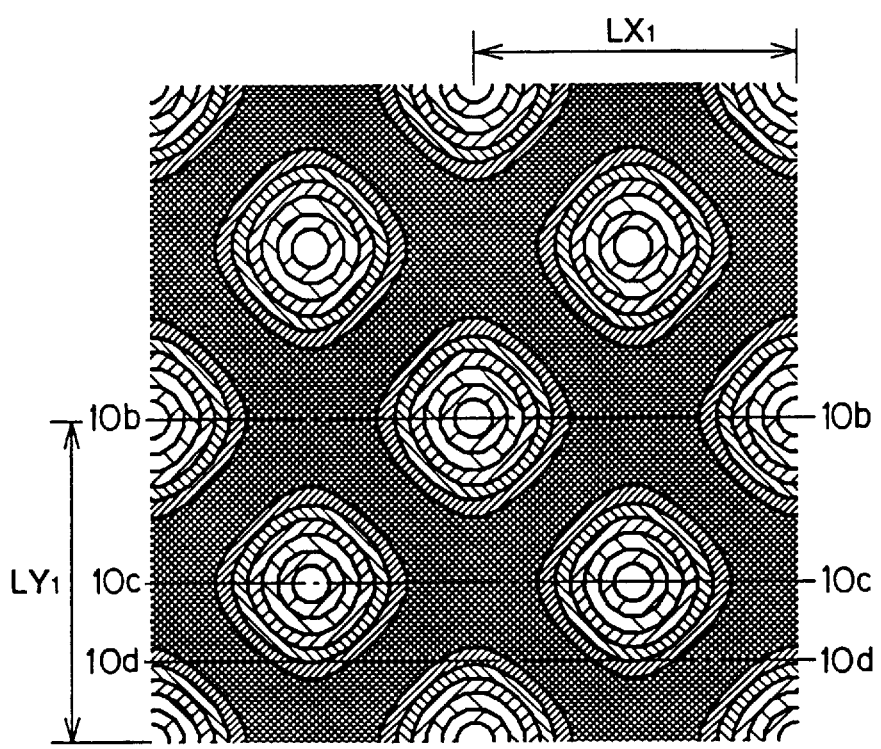
FIGS. 11 to 14 are first to fourth illustrations each showing the intensity distribution of an optical image on photoresist.

FIG. 11 shows the intensity distribution of an optical image where focus offset ΔF is 0 μm. In FIG. 11, the intensity distributions of the optical image along C—C, D—D and E—E correspond to (b), (c), and (d) in FIG. 10, respectively.

Referring to FIG. 11 or FIG. 10 at (b), (c), and (d), the empty portion is a region with high intensity exposure light, the densely hatched portion is a region with low intensity exposure light. There is an adequate contrast relative to optical intensity SL. Length $LX_1$, $LY_1$ between the centers of adjacent empty regions in the X- or Y-direction is 0.64 μm. Since line widths Wn, Ws and Wa are identical, the distance between the centers of the most adjacent empty regions is equal to the square root of 2 times the line width, i.e., about 0.23 μm in this case.

Figure 12:
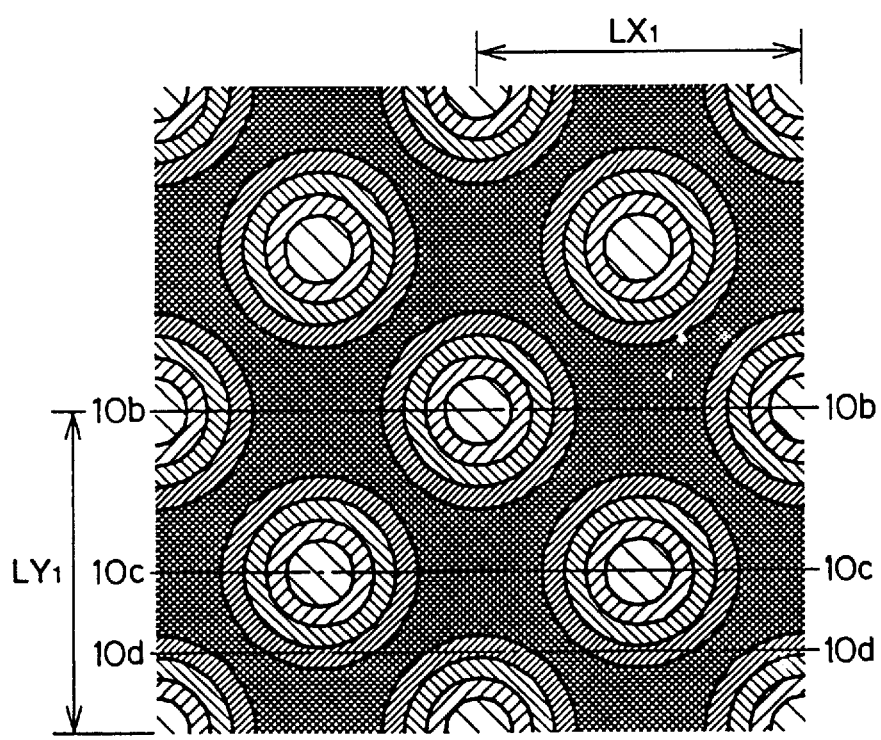

Now, FIG. 12 shows the intensity distribution of an optical image with focus offset μF of 1.0 μm. In this case, as compared to the intensity distribution of the optical image shown in FIG. 11, the contrast of the optical image is adequate in terms of practical use although the optical image is somewhat blurry for defocus.

A description of a second simulation follows in which first and second phase shift masks have different line widths Wn, Ws and Wa. Wn, Ws and Wa in first phase shift mask 10A shown in FIG. 23 are each 0.16 μm, while Wn, Ws, and Wa in second phase shift mask 10B shown in FIG. 24 are each 0.20 μm. The other simulation conditions are the same as those of the first simulation.

Figure 13:
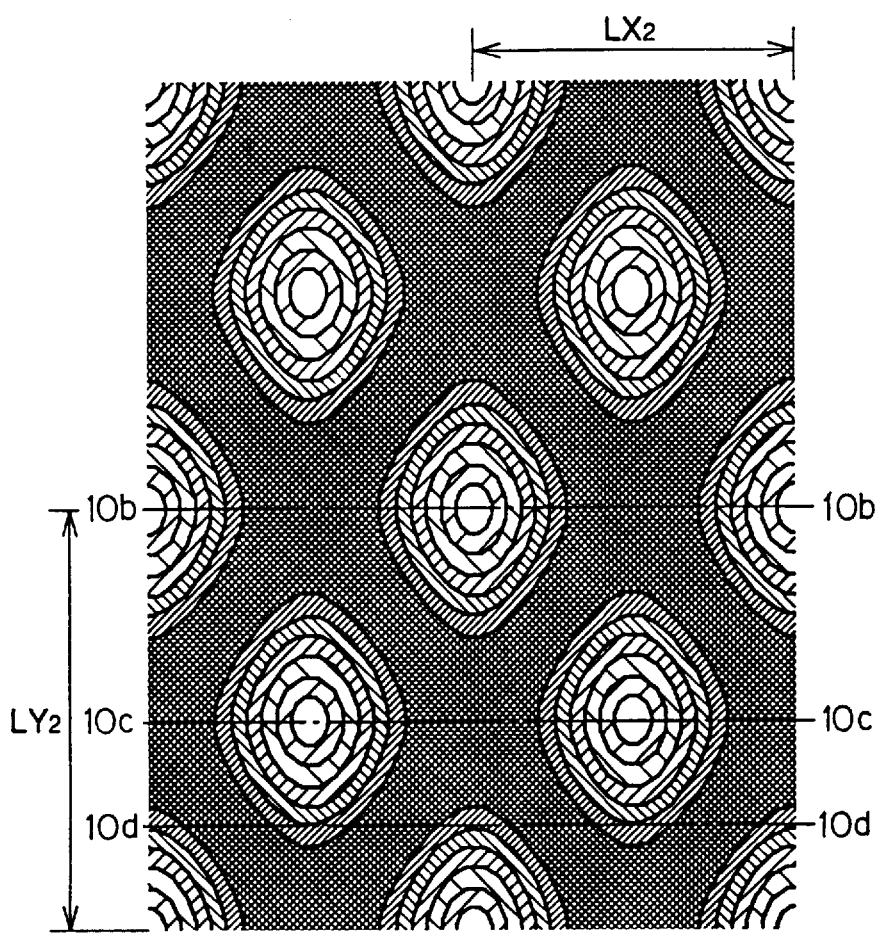

FIG. 13 shows the intensity distribution of an optical image with focal offset ΔF of 0 Mm. The intensity of the optical images along C—C, D—D and E—E correspond to (b), (c) and (d) in FIG. 10, respectively. Under these conditions, distance $LX_2$ between the centers of adjacent empty regions along the X-direction is 0.64 82 m, while distance $LY_2$ between the centers of adjacent empty regions along the Y-direction is 0.80 μm.

Figure 14:
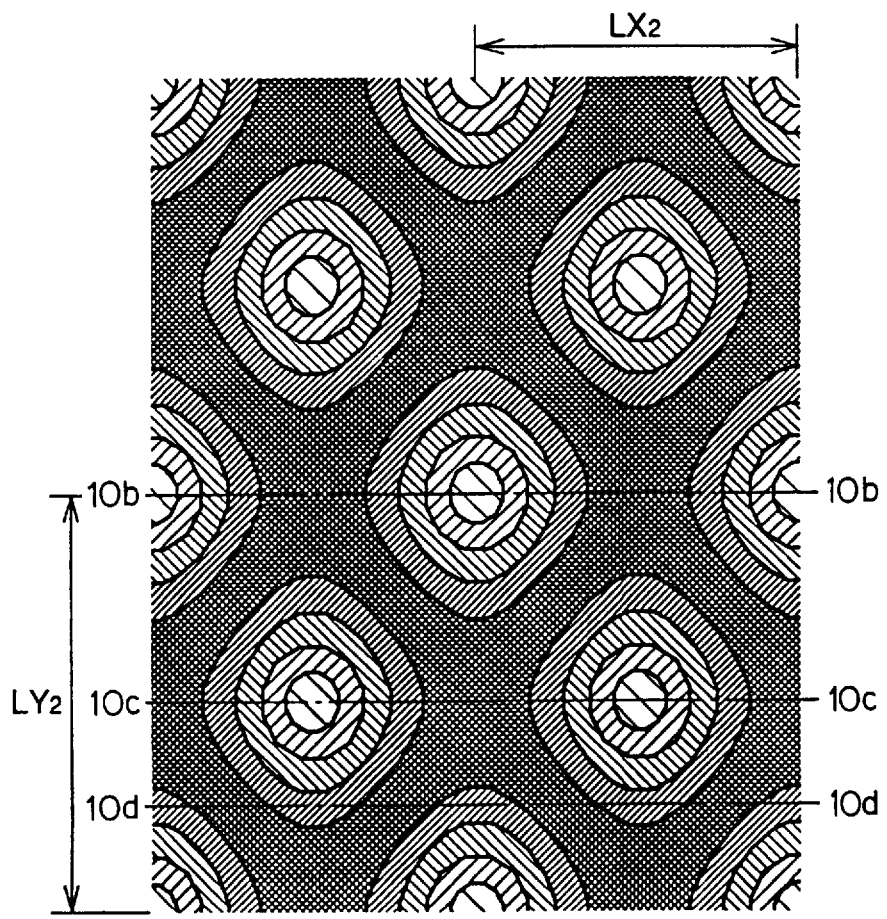
Figure 15A:
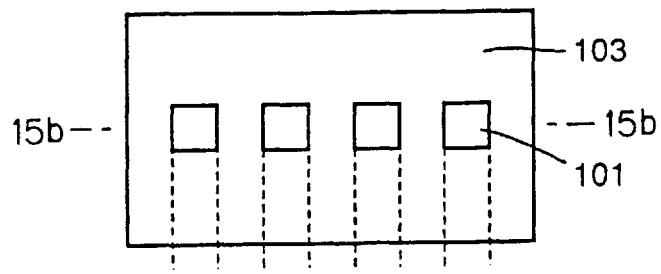
FIG. 15 is a first representation for use in illustration of a conventional patterning method, wherein (a) is a plan view of a mask, (b) is a cross section taken along line A—A in (a), (c) shows the electric field of exposure light on the mask, and (d) shows the intensity of the exposure light on the wafer.
Figure 15B:
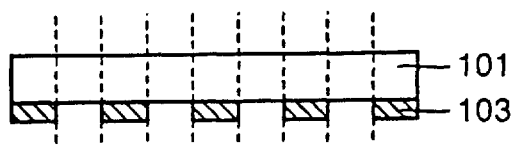
Figure 15C:
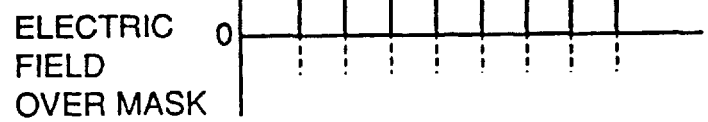
Figure 15D:
Figure 16A:
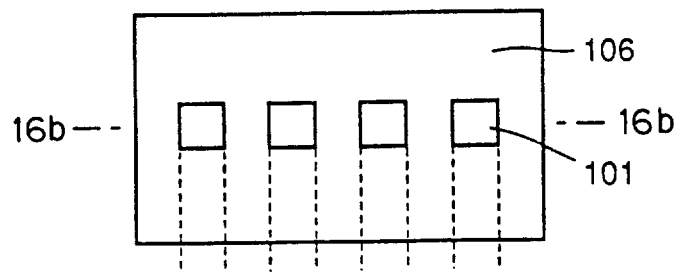
FIG. 16 is a second representation for use in illustration of a conventional patterning method, wherein (a) is a plan view of a half tone mask, (b) is a cross section taken along line A—A in (a), (c) shows the electric field of the exposure light on the mask, and (d) shows the intensity of exposure light on the wafer.
Figure 16B:
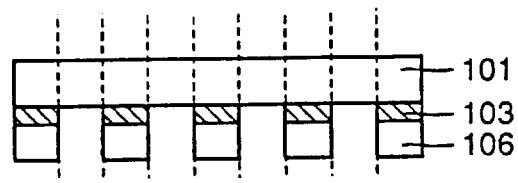
Figure 16C:
Figure 16D:
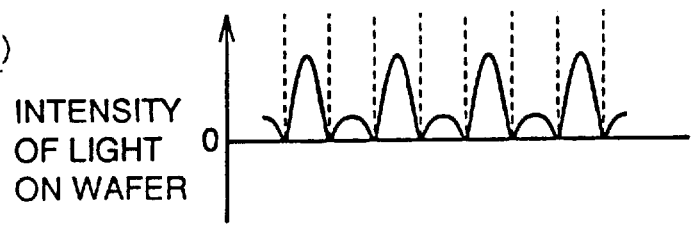
Figure 17A:
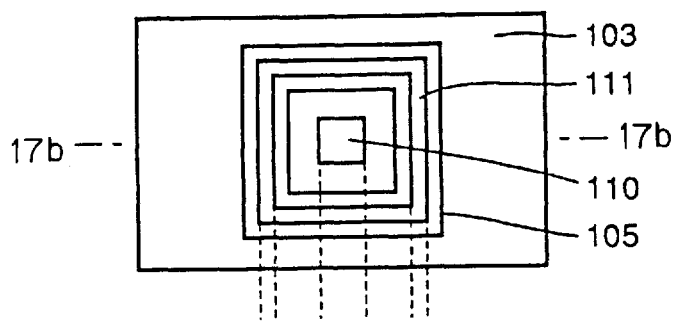
FIG. 17 is a third representation for use in illustration of a conventional patterning method, wherein (a) is a plan view of a Levenson-type phase shift mask, (d) shows a cross section taken along line A—A in (a), (c) shows the electric field of exposure light on the mask, and (d) shows the intensity of exposure light on the wafer.
Figure 17B:
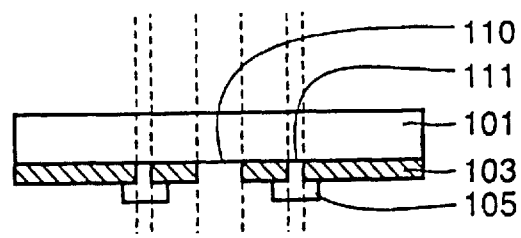
Figure 17B:
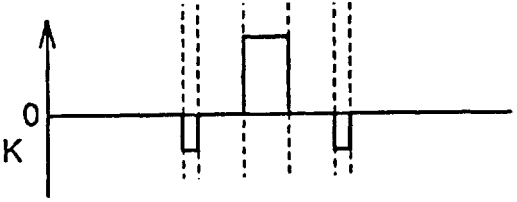
Figure 17B:
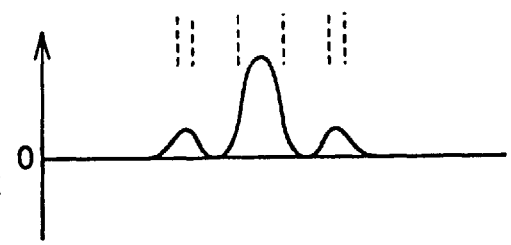
Figure 18A:
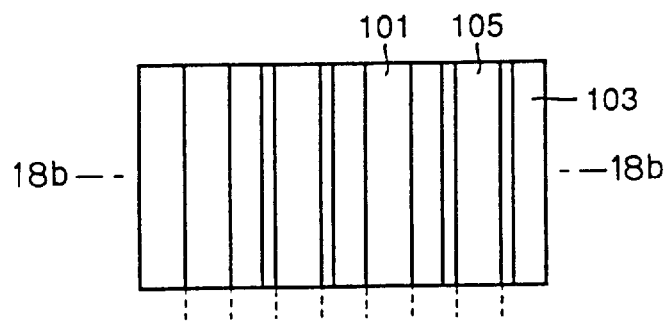
FIG. 18 is a fourth representation for use in illustration of a conventional patterning method, wherein (a) is a plan view of a Levenson-type phase shift mask, (b) is a cross section taken along lines A—A in (a), (c) shows the electric field of exposure light on the mask, and (d) shows the intensity of exposure light on the wafer.
Figure 18B:
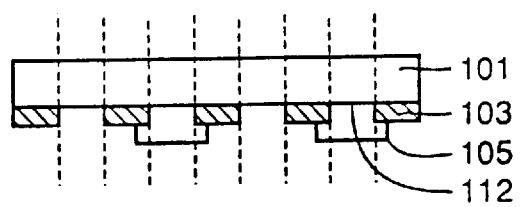
Figure 18C:
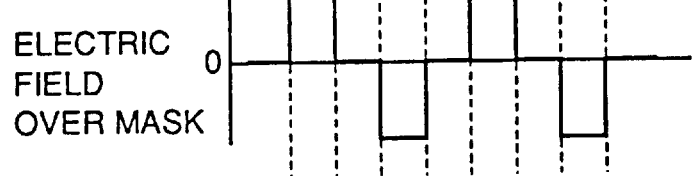
Figure 18D:
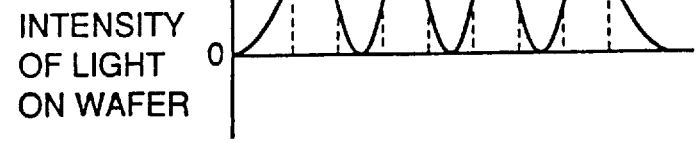

FIG. 14 shows the intensity distribution of an optical image with focus offset μF of 1.0 μm. Also in this case, the optical image is somewhat blurry due to defocus as compared to the optical image with the intensity distribution shown in FIG. 13, but the contrast of the optical image is adequate in terms of practical use.

In comparison between the intensity distribution of the optical image shown in FIG. 11 and the intensity distribution of the optical image shown in FIG. 13, the case shown in FIG. 11 has a larger number of empty regions in a fixed area. More specifically, the line widths of two phase shift masks are preferably equalized in order to form a dense hole pattern.

In the process of developing photoresist subjected to exposure by interference as described above, photoresist corresponding to empty regions in FIGS. 11 to 14 dissolve if the photoresist is of positive type and a hole pattern is formed. In addition, since the optical image has adequate contrast as described above, a hole pattern with high size precision may be formed. The most dense hole pattern within a fixed area may be formed by equalizing the line widths of the first and second phase shift masks shown in FIGS. 23 and 24.

Note that in the above-described embodiment, the transmission portions of first phase shift mask and second phase shift mask are placed approximately perpendicularly to each other, the angle of crossing does not have to be right angle as long as the transmitting portions cross each other.

Figure 19:
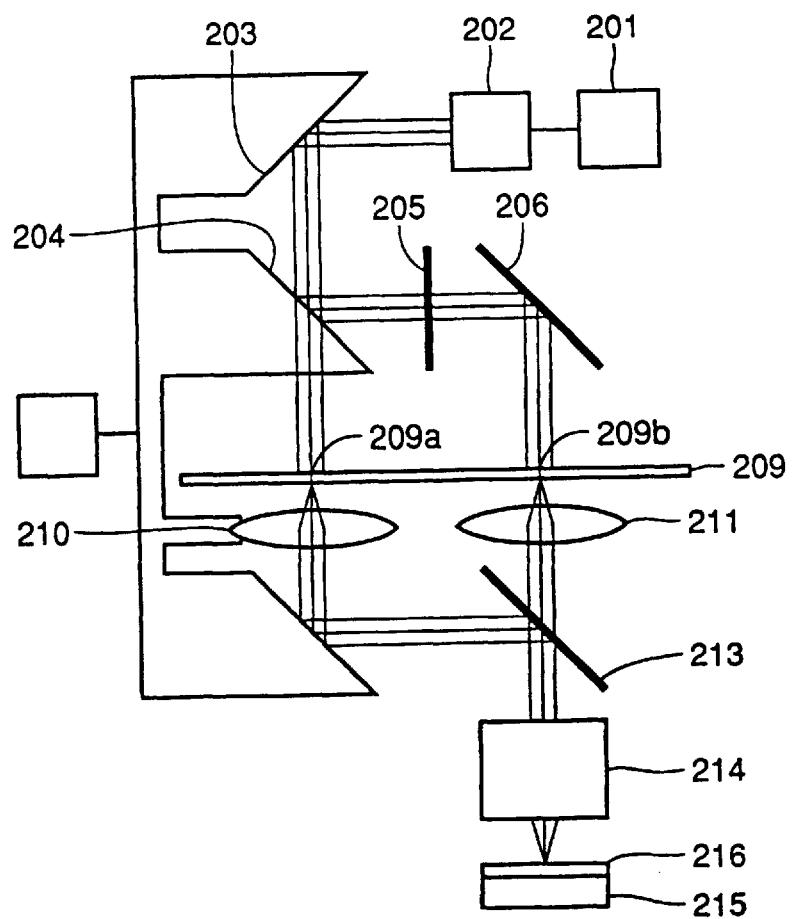
FIG. 19 is a schematic illustration showing the configuration of a conventional aligner or part of the configuration of an aligner according to one embodiment of the invention.
Figure 20A:
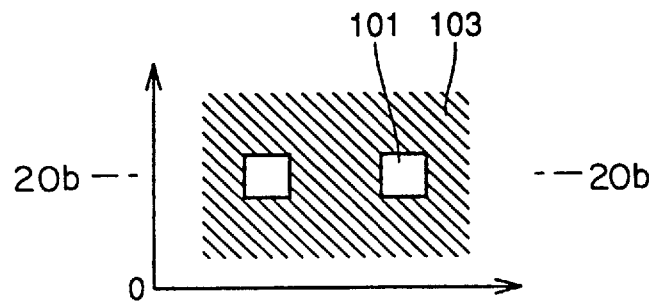
FIG. 20 is a fifth representation for use in illustration of a conventional patterning method, wherein (a) is a plan view of a usual photomask, (b) is a cross section taken along line A—A in (a), and (c) shows the amplitude of the exposure light immediately after being transmitted through the photomask.
Figure 20B:
Figure 20C:
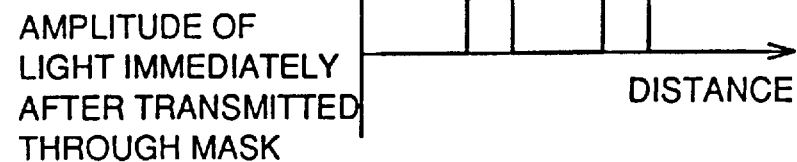
Figure 21A:
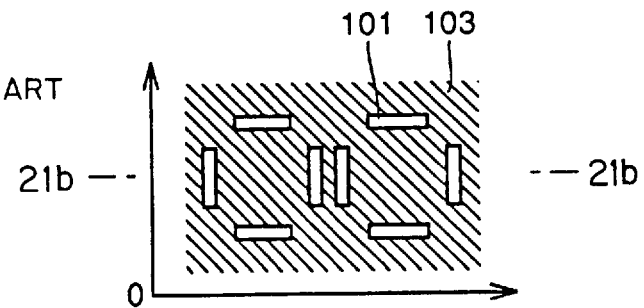
FIG. 21 is a sixth representation for use in illustration of a conventional patterning method, wherein (a) is a plan view of a usual photomask, (b) is a cross section taken along line A—A in (a), and (c) shows the amplitude of exposure light immediately after being transmitted through the photomask.
Figure 21B:
Figure 21C:
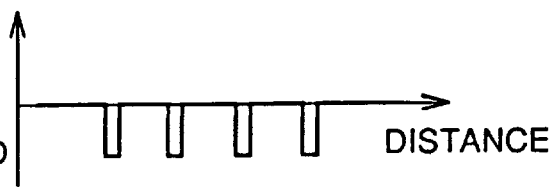
Figure 22A:
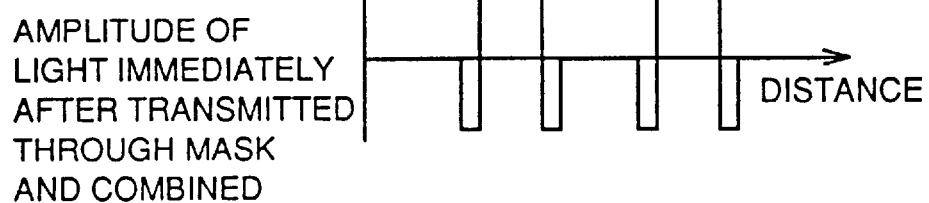
FIG. 22 is a seventh representation for use in illustration of a conventional patterning method, wherein (a) shows the amplitude of exposure light immediately after being transmitted through the photomask, (b) shows the amplitude of exposure light on the wafer, and (c) shows the intensity of exposure light on the wafer.
Figure 22B:
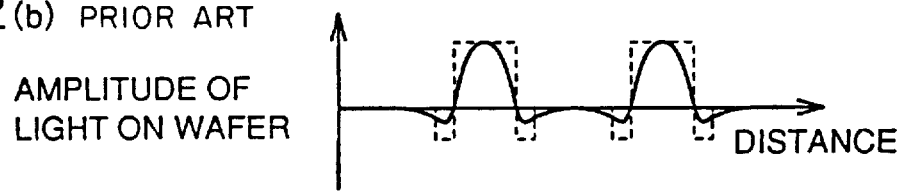
Figure 22C:
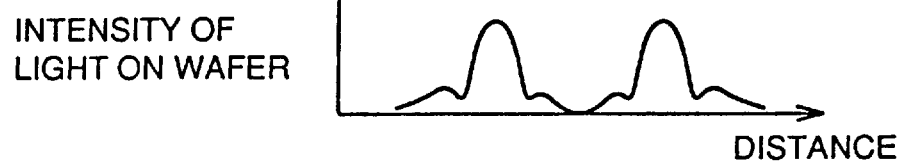

In the above-described embodiment, two phase shift masks, i.e., the first and second phase shift masks are used. However, a single phase shift mask having a mask pattern for the first phase shift mask and a mask pattern for the second phase shift mask fabricated in prescribed regions thereof may be employed. In such a case, the phase shift mask may be used as a phase shift mask 209 for example in an interference type aligner as shown in FIG. 19. Note that phase shift portion 205 will not be necessary since the phase shift mask has a phase shifter in that case.

In addition, as shown in FIGS. 23 and 24, the width of each strip shaped transmission portion is fixed in the above description, but the portion may be partly wider or narrower.

In addition to use of KrF light as exposure light as described, g rays and i rays, and ArF light may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A patterning method, using a first phase shift mask having a plurality of first strip-shaped transmission regions spaced apart and extending in a first direction, first strip-shaped light shielding regions between said plurality of first strip-shaped transmission regions and phase shifters provided for every other one of said plurality of first strip-shaped transmission regions, and a second phase shift mask having a plurality of second strip-shaped transmission regions spaced apart and extending in a second direction crossing said first direction, second strip-shaped light shielding regions between said plurality of second strip-shaped transmission regions, and phase shifters provided for every other one of said plurality of second strip-shaped transmission regions, said method comprising the steps of:

irradiating said first phase shift mask with a first exposure light beam separated from first and second exposure light beams emitted from a light source, and irradiating said second phase shift mask with said second exposure light beam; and causing first transmission exposure light transmitted through said first phase shift mask and second transmission exposure light transmitted through said second phase shift mask to be combined by interference, thereby irradiating photoresist on a semiconductor substrate with exposure light resulting from the interference.

2. The patterning method as recited in claim 1, wherein a positive type photoresist is used as said photoresist.

3. The patterning method as recited in claim 2, wherein:

a single phase shift mask having a mask pattern identical to the mask pattern formed in said first and second phase shift masks formed in its prescribed regions as is used said first and second phase shift masks.

4. The patterning method as recited in claim 1, wherein:

a single phase shift mask having a mask pattern identical to the mask patterns formed in said first and second phase shift masks formed in its prescribed regions is used as said first and second phase shift masks.

5. A phase shift mask for use in an aligner for patterning by separating exposure light emitted from a light source into first and second exposure light beams, and irradiating photoresist on a semiconductor substrate with an exposure light resulting from interference and combination of said first and second exposure light beams, said phase shift mask having a first region at a position to be irradiated with said first exposure light and a second region at a position to be irradiated with said second exposure light, wherein:

in said first region, a plurality of first strip-shaped transmission regions of a prescribed width, spaced apart and extending in a first direction, and a plurality of first strip shaped light shielding regions between said plurality of first strip-shaped transmission regions, are provided;

a phase shifter for shifting the phase of transmitted light from the phase of said exposure light is provided for every other one of said plurality of first strip-shaped transmission regions;

in said second region, a plurality of second strip-shaped transmission regions spaced apart and extending in a second direction crossing said first direction and a plurality of second strip-shaped light shielding regions between said plurality of second strip-shaped transmission regions, are provided; and a phase shifter is provided for every other one of said plurality of second strip-shaped transmission regions.

* * * * *

UNITED STATES PATENT AND TRADEMARK OFFICE
CERTIFICATE OF CORRECTION

PATENT NO. : 5,863,677

DATED : January 26, 1999

INVENTOR(S) : NAKAO

Figure 27:
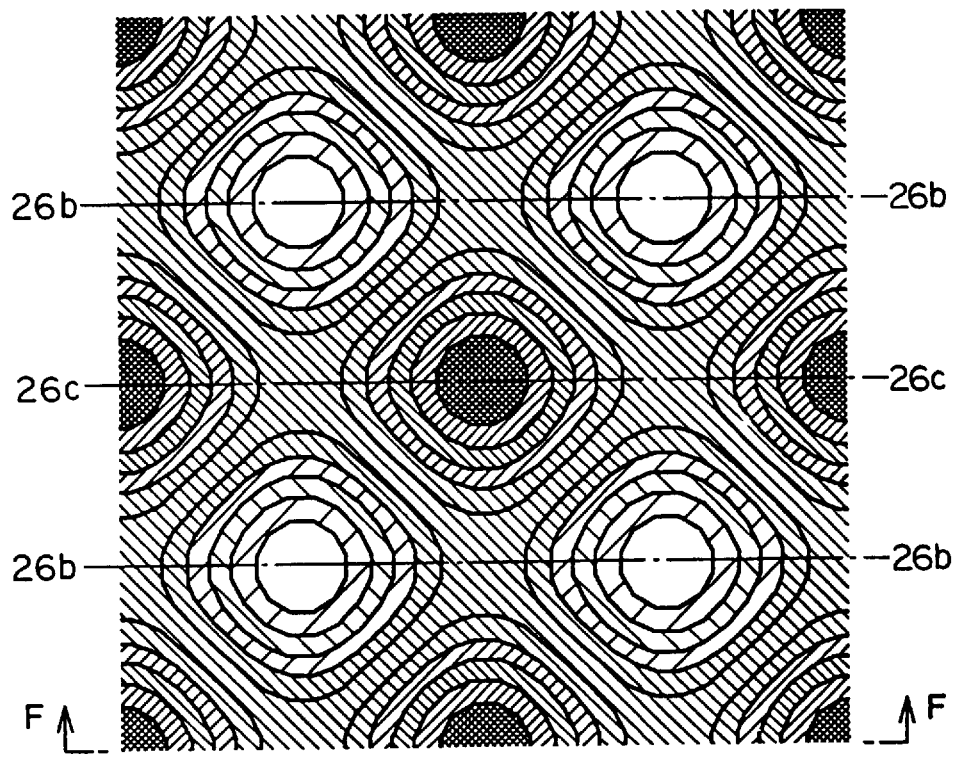
FIG. 27 is an illustration showing the intensity distribution of the exposure light over the wafer upon double exposure using conventional first and second phase shift masks.
Figure 28:
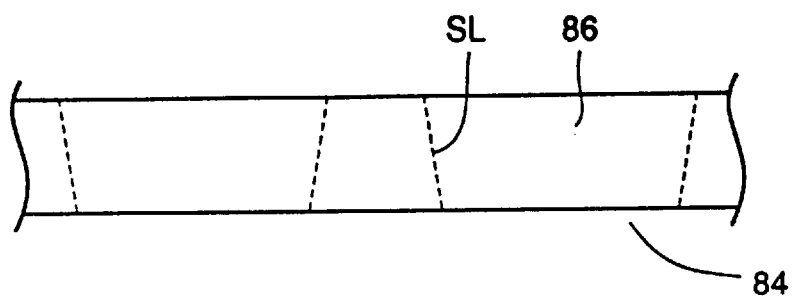
FIG. 28 is a diagram showing the intensity of exposure light along F—F in FIG. 27 in the direction of the depth of the photoresist.

It is certified that error appears in the above-indentified patent and that said Letters Patent is hereby corrected as shown below:

Column 4, line 6, change "A-A" to --20b-20b and 21b-21b--;
line 49, change "A-A" to --25-25--;

Column 5, line 3, change "B-B" to --25-25--;
line 15, change "C-C and E-E" to --lines 26b-26b--; and
line 16, change "D-D" to --26c-26c--;
lines 48-50, change "C-C, C-C and E-E in Fig. 27 correspond to C-C, D-D and E-E" to --26b-26b, 26c-26c and 26b-26b in Fig. 27 correspond to 26b-26b, 26c-26c and 26b-26b--;

Column 6, line 42, change "C-C or E-E" to --lines 26b-26b--;
line 45, change "C-C or E-E" to --lines 26b-26b--;

Column 10, line 33, change "A-A" to --25-25--;
line 37, change "C-C" to --26b-26b--;
line 42, change "D-D" to --26c-26c--;
line 46, change "A-A" to --25-25--;
line 61, change "C-C" to --10b-10b--;
line 63, change "D-D" to --10c-10c--;
line 64, change "E-E" to --10d-10d--;

Column 11, line 3, change "A-A" to --15b-15b--;
line 10, change "A-A" to --16b-16b--;
line 16, change "A-A" to --17b-17b--;
line 23, change "A-A" to --18b-18b--;
line 32, change "A-A" to --20b-20b--;
line 38, change "A-A" to --21b-21b--;
line 55, change "A-A" to --25-25--;
line 61-62, change "C-C and E-E" to --26b-26b--;
line 63, change "D-D" to --26c-26c--;

Column 12, lines 59-60, change "A-A in Fig. 23 and B-B" to --line 25-25 in Fig. 23 and 25-25--;

UNITED STATES PATENT AND TRADEMARK OFFICE
CERTIFICATE OF CORRECTION

PATENT NO. : 5,863,677
DATED : January 26, 1999
INVENTOR(S) : NAKAO

It is certified that error appears in the above-indentified patent and that said Letters Patent is hereby corrected as shown below:

Column 13, line 7, change "A-A" to --25-25--;
            line 21, change "C-C" to --26b-26b--;
            line 22, change "D-D" to --26c-26c--;
            line 49, change "A-A" to --25-25--;
            line 50, change "C-C" to --26b-26b--;
            line 52, change "A-A" to --25-25--;
            line 53, change "D-D" to --26c-26c--;
            line 54, change "E-E" to --26b-26b--;
            line 55, change "A-A" to --25-25--;
            line 67, change "C-C" to --10b-10b--;

Column 14, line 1, change "D-D" to --10c-10c--;
            lines 46-47, change "C-C, D-D and E-E" to --10b-10b, 10c-10c and 10d-10d--;

Column 15, line 7, change "C-C, D-D and E-E" to --10b-10b, 10c-10c and 10d-10d--.

Signed and Sealed this

Twenty-eighth Day of September, 1999

Attest:

Q. TODD DICKINSON

*Attesting Officer*      *Acting Commissioner of Patents and Trademarks*